(12) United States Patent
Kitajima et al.

(10) Patent No.: US 9,395,398 B2
(45) Date of Patent: Jul. 19, 2016

(54) TRANSFORMER CONNECTION PHASE DETERMINATION DEVICE AND METHOD

(71) Applicant: FUJITSU LIMITED, Kawasaki-shi, Kanagawa (JP)

(72) Inventors: Hironobu Kitajima, Kawasaki (JP); Hideyuki Kikuchi, Chigasaki (JP); Yuta Teranishi, Fukuoka (JP)

(73) Assignee: FUJITSU LIMITED, Kawasaki (JP)

( * ) Notice: Subject to any disclaimer, the term of this patent is extended or adjusted under 35 U.S.C. 154(b) by 24 days.

(21) Appl. No.: 14/608,378

(22) Filed: Jan. 29, 2015

(65) Prior Publication Data

US 2015/0241490 A1      Aug. 27, 2015

(30) Foreign Application Priority Data

Feb. 27, 2014   (JP) ................. 2014-037403

(51) Int. Cl.
   *G01R 25/00*   (2006.01)
   *G01R 29/18*   (2006.01)
   *G01R 21/133*  (2006.01)

(52) U.S. Cl.
   CPC .............. *G01R 29/18* (2013.01); *G01R 21/133* (2013.01)

(58) Field of Classification Search
   None
   See application file for complete search history.

(56) References Cited

U.S. PATENT DOCUMENTS

| 4,788,494 A | 11/1988 | Faulkner | |
|---|---|---|---|
| 2012/0221265 A1* | 8/2012 | Arya .................. | G01R 29/18 702/61 |

FOREIGN PATENT DOCUMENTS

| JP | 61-246672 | 11/1986 |
|---|---|---|
| JP | 2003-185693 | 7/2003 |
| JP | 2006-349589 | 12/2006 |
| JP | 2008-500519 | 1/2008 |
| JP | 2012-159334 | 8/2012 |
| JP | 2012-198033 | 10/2012 |
| WO | WO 2005/116668 A1 | 12/2005 |

OTHER PUBLICATIONS

Patent Abstracts of Japan, Publication No. 2003-185693, published Jul. 3, 2003.
Patent Abstracts of Japan, Publication No. 2006-349589, published Dec. 28, 2006.

(Continued)

*Primary Examiner* — Clayton E Laballe
*Assistant Examiner* — Jas Sanghera
(74) *Attorney, Agent, or Firm* — Staas & Halsey LLP

(57) ABSTRACT

A transformer connection phase determination device includes a processor that executes a procedure includes: acquiring a power value consumed by at least one consumer connected to a transformer connected to any phase corresponding to a combination of two of a plurality of distribution lines, and acquiring respective current values flowing in each of the plurality of distribution lines, in association with a time axis; applying a filter that attenuates low frequency components in a current value caused by the power value and in the respective current values flowing in the plurality of respective power distribution lines; computing respective correlation values indicating correlation between the current values caused by the power values to which the filter has been applied, and the respective current values flowing in the plurality of respective power distribution lines to which the filter has been applied; and determining the phase that the transformer is connected to.

13 Claims, 12 Drawing Sheets

(56) References Cited

OTHER PUBLICATIONS

Espacenet Bibliographic Data, Publication No. JP2008500519 (A), published Jan. 10, 2008.
Patent Abstracts of Japan, Publication No. 2012-159334, published Aug. 23, 2012.
Patent Abstracts of Japan, Publication No. 2012-198033, published Oct. 18, 2012.

* cited by examiner

FIG.8

| CONSUMER ID | TRANSFORMER ID | POWER DISTRIBUTION SECTOR ID | DATA AVAILABILITY FLAG |
|---|---|---|---|
| d1 | T1 | I1-2 | PRESENT |
| d2 | T2 | I1-2 | PRESENT |
| d3 | T2 | I1-2 | PRESENT |
| d4 | T2 | I1-2 | ABSENT |
| d5 | T3 | I2-3 | PRESENT |
| d6 | T3 | I2-3 | ABSENT |
| ... | ... | ... | ... |

FIG.9

| CONSUMER ID | ... | DATE/0:00 | DATE/0:30 | DATE/1:00 | DATE/1:30 | ... |
|---|---|---|---|---|---|---|
| d1 | 0.50 | 0.53 | 0.60 | 0.65 | 0.42 | ... |
| d2 | 0.55 | 0.65 | 0.62 | 0.71 | 0.78 | ... |
| d3 | 0.60 | 0.51 | 0.44 | 0.40 | 0.37 | ... |
| ... | ... | ... | ... | ... | ... | ... |

FIG.10

| POWER DISTRIBUTION SECTOR ID | ... | DATE/0:00 | DATE/0:30 | DATE/1:00 | DATE/1:30 | ... |
|---|---|---|---|---|---|---|
| I1-2-a | 60 | 63 | 60 | 62 | 58 | ... |
| I1-2-b | 65 | 65 | 62 | 61 | 68 | ... |
| I1-2-c | 60 | 61 | 64 | 60 | 67 | ... |
| I1-3-a | 50 | 53 | 60 | 52 | 58 | ... |
| I1-3-b | 55 | 55 | 52 | 61 | 58 | ... |
| I1-3-c | 51 | 52 | 55 | 57 | 56 | ... |
| ... | ... | ... | ... | ... | ... | ... |

TRANSFORMER CONNECTION PHASE DETERMINATION DEVICE AND METHOD

CROSS-REFERENCE TO RELATED APPLICATION

This application is based upon and claims the benefit of priority of the prior Japanese Patent Application No. 2014-037403, filed on Feb. 27, 2014, the entire content of which is incorporated herein by reference.

FIELD

The embodiments discussed herein are related to a transformer connection phase determination device, a transformer connection phase determination method, and a recording medium storing a transformer connection phase determination program.

BACKGROUND

Hitherto, as technology for determining the connection phase of a transformer, there has been a proposal for a phase distinguishing device that acquires measurement values of power breakers and sensor-containing partitioning switches through breaker substations, switching substations, and a power distribution monitoring and control master station, and acquires measurement values of smart meters through an automatic meter master station. The phase distinguishing device has power distribution system configuration data, power distribution transformer device data, and consumer supply equipment data stored in a data storage section. A time segment is selected that is a period, out of each of the measurement periods of measurement values, for employment in distinguishing the connection phase. The connection phase of each of the power distribution convertors is then distinguished based on each of the measurement values measured in the selected time segment, and on each of the items of data stored in the data storage section.

RELATED PATENT DOCUMENTS

Japanese Laid-Open Patent Publication No. 2012-198033

SUMMARY

According to an aspect of the embodiments, a transformer connection phase determination device includes a processor configured to execute a process. The process includes: acquiring a power value consumed by at least one consumer connected to a transformer connected to any phase corresponding to a combination of two of plural distribution lines, and acquiring respective current values flowing in each of the plural distribution lines, in association with a time axis; applying a filter that attenuates low frequency components in a current value caused by the power value and in the respective current values flowing in the plurality of respective power distribution lines; computing respective correlation values indicating correlation between the current values caused by the power values to which the filter has been applied, and the respective current values flowing in the plural respective power distribution lines to which the filter has been applied; and determining the phase that the transformer is connected to, based on the respective correlation values.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF DRAWINGS

FIG. 8 is a diagram illustrating an example of a power distribution data table;

FIG. 9 is a diagram illustrating an example of a power consumption data table;

FIG. 10 is a diagram illustrating an example of a line current data table;

DESCRIPTION OF EMBODIMENTS

Figure 1:
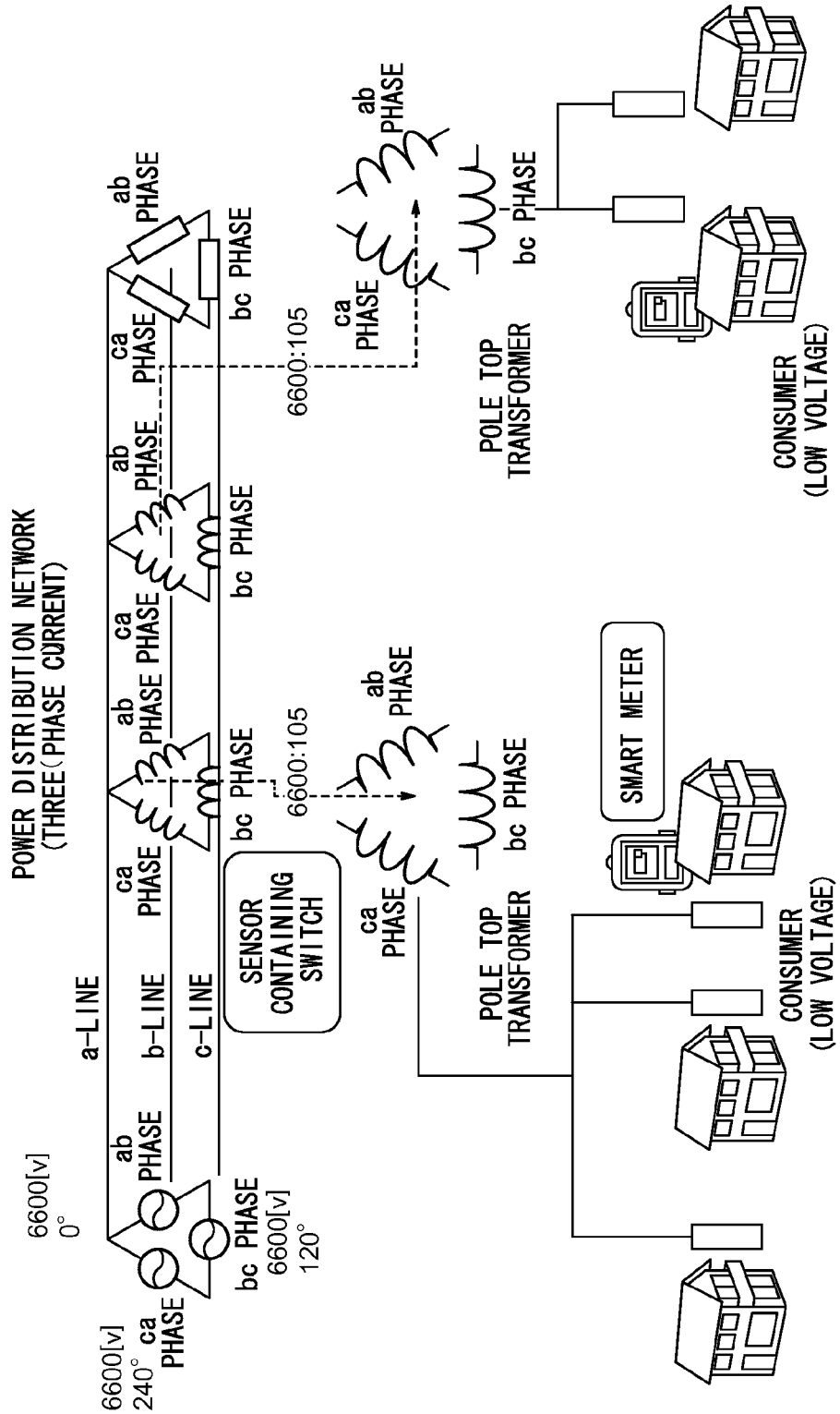
FIG. 1 is a schematic diagram illustrating an example of a power distribution network.

Detailed explanation follows regarding an exemplary embodiment according to technology disclosed herein, with reference to the drawings.

Regarding the Transformer Connection Phase Determination Problem

With the opening up of the power supply market through deregulation of electricity businesses, and the proliferating trend towards renewable power, the functions demanded of power distribution systems acting as power transfer means have recently been changing significantly. In such power distribution systems, there are significant issues regarding measures to address the expected large scale introduction of distributed power sources, such as solar power (photovoltaics (PV)). An example of such an issue is the need for voltage management to keep the supply voltage of power distribution systems within a fixed range (such as, for example, 101±6V, or 202±20V).

A major issue with voltage management in conventional power distribution systems is that voltage drops with excessive load; however, in distributed power source power distribution systems, since a reverse flow is generated to sell electricity, it is voltage rises that occur at such occasions that are a significant issue. Existing power distribution systems are designed and operated with the presumption of preventing voltage drops; however, issues related to voltage rises are hardly anticipated. Development has begun of new voltage management methods, such as those utilizing various passive mechanisms and active mechanisms in power electronics as countermeasures to such voltage rise issues.

An issue regarding the pole top transformer connection phase has surfaced during investigations into new voltage management methods. This issue is the problem, in a three phase line power distribution system, of not knowing which phase the high voltage side of a given transformer at the consumer-side connection point is connected to out of the combination of 3 types of power distribution line (phases). The transformer connection phase is selected so as to achieve the best balance in load from plural consumers in order to maintain an equilibrium in three phase alternating current. However there are hardly any records held or management performed of specifically which transformer connection phase it is to which each consumer is connected. There is accordingly a need to start investigations into the application of new voltage management methods by surveying the current state of transformer connection phases.

Normally there is a single transformer installed for from 10 to 20 consumers, and if the power distribution system is considered as a whole then there are a vast number of transformers for which the connection phase needs to be determined. There would accordingly be a large cost and time spent if the transformer connection phases were manually determined for a whole power distribution system.

An object of the present exemplary embodiment is to determine the transformer connection phase even in situations in which there is only usable data on power consumption for some of the consumers connected to a transformer. More detailed explanation follows regarding the transformer connection phase determination problem underlying the present exemplary embodiment.

FIG. 1 illustrates an example of a power distribution network. In a three phase three line power distribution system there are three possibilities for the connection phase of the pole top transformer. The power distribution lines on the high voltage side (6.6 kV) are referred to here as a-line, b-line, and c-line, and possible combinations of power distribution lines for the transformer connection phase are an ab-phase, a bc-phase, and a ca-phase. Although most pole top transformers are actually single phase, the pole top transformer is illustrated with three phases to demonstrate that there plural possibilities for the connection phase. In an actual power distribution system, a transformer is normally limited to connection to a single phase, and operation is performed so as to allow load to be balanced across the three phases by allocating a given phase for each of the transformers.

At the high voltage side of the power distribution system, there are a number of sensor containing switches enabling measurement values to be acquired for the 3 types of line current and inter-line voltage. The consumer is connected to the secondary side of the transformer, and receives a contracted voltage (for example 100V). Power meters equipped with communication functions, such as smart meters, are being introduced for some consumers, and these continuously measure the power consumption of the consumers. Data of connection relationships between each consumer and transformer is managed by the power company; however, there are generally no records or management of data of the connection phase to which the transformer is connected.

The data of the transformer connection phase has importance for voltage management of the power distribution system; however, there is a large cost and time spent to survey such data. Consideration has accordingly been given to determining the transformer connection phase based on the measurement data of the sensor containing switches and power meters on the consumer side. Specific conditions follow regarding the "transformer connection phase determination problem".

The following are categories of data that can be used to determine transformer connection phases.

(1) measurement values of sensor containing switches
  line current on the high voltage side of the power distribution system (a-line, b-line, c-line)
  inter-line voltage on the high voltage side of the power distribution system (between lines a-b, between lines b-c, and between lines c-a).
(2) measurement values of power meters with communication functions
  power consumption amount of consumer (only from those consumers who have installed power meters with communication functions).
(3) consumer management data
  connection relationships between each consumer and transformer (transformer connection phase unclear).

The sensor containing switches of (1) are currently being introduced in power distribution systems, and installing from 1 to several sensor containing switches for a single feeder is practical. A feeder is a portion of a power distribution system centered on a power distribution transformer station, and in urban areas a single feeder normally includes about 1000 consumers. The uptake of communication function equipped power meters of (2) is currently 2% or less, as of February 2012; however, installation is expected to proceed rapidly from now. The sampling interval for measuring the amount of power with power meters differs between the various types of power meter, and is, for example, a 30 minute interval. Regarding (3), there are cases in which data of the transformer connection phase utilization is also contained in addition to the data of connection relationships. For example, the connection phases of streetlight lines are normally limited to one per transformer.

As described above, determination of the transformer connection phase based on the currently usable data is the "transformer connection phase determination problem" underlying the present exemplary embodiment.

It is generally natural to use circuit logic computation as the basis for determining connection relationships of circuits, such as transformer connection phases, from electrical data of power distribution systems. However, in the usable data above, there is a distinct lack of data for performing deterministic circuit calculations. It is accordingly difficult to determine the transformer connection phase by circuit logic computation based on the usable data. Determining the transformer connection phase by utilizing statistical correlation data in the usable data might be considered as the next best approach.

Considering combinations of usable data at the high voltage side and the low voltage side (consumer side) of the power distribution system, employing power data to implement a correlation analysis method is conceivable. If there is power data, then direct measurement values are obtainable from both the high voltage side and the low voltage side. Suppose it were possible to calculate power for each of the individual power distribution lines on the high voltage side, and the power distribution lines configuring the power supply path were unique for the connection phase of the transformer to which the consumer is connected. In such cases, it would be possible to determine the transformer connection phase by implementing correlation analysis of time series data of power of individual power distribution lines, against time series data of power consumption of the consumer.

However, for example as illustrated in FIG. 1, it is fundamentally difficult (for reasons given later) to determine the transformer connection phase based on a correlation analysis method using power data for a power distribution system in which each of the pole top transformers is connected to one phase out of three phases in a three phase three line system. Thus in the present exemplary embodiment, the transformer connection phase is determined by correlation analysis using current data rather than power data.

Configuration of Transformer Connection Phase Determination Device

Figure 2:
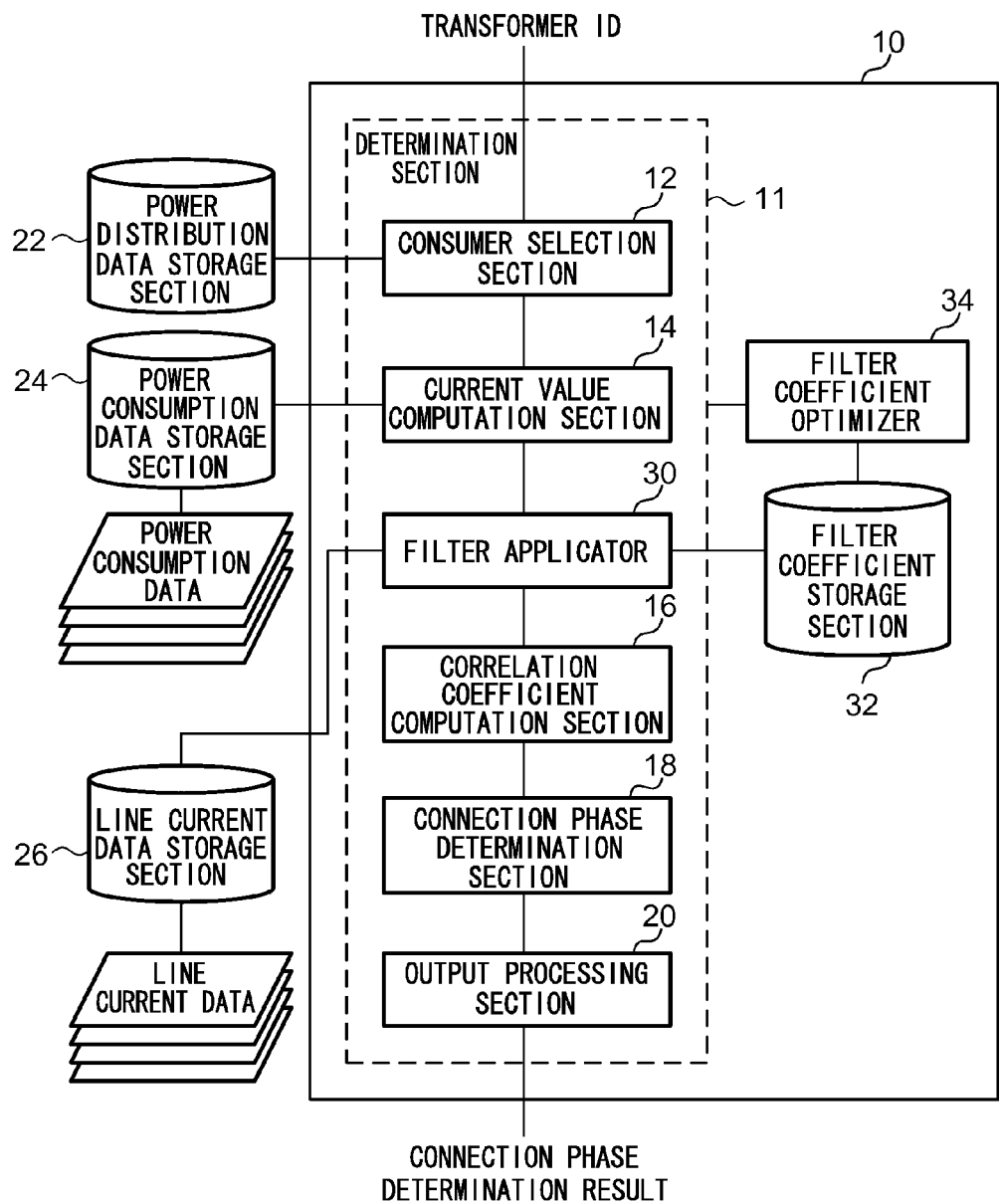
FIG. 2 is a block diagram illustrating a schematic configuration of a transformer connection phase determination device according to an exemplary embodiment.

As illustrated in FIG. 2, the transformer connection phase determination device 10 according to the present exemplary embodiment includes a determination section 11 and a filter coefficient optimizer 34. The determination section 11 includes a consumer selection section 12, a current value computation section 14, a filter applicator 30, a correlation coefficient computation section 16, a connection phase determination section 18, and an output processing section 20.

The consumer selection section 12 receives as an input a transformer ID indicating the transformer for which connection phase determination is being performed, and selects a power distribution sector and consumer corresponding to the transformer ID.

Figure 3:
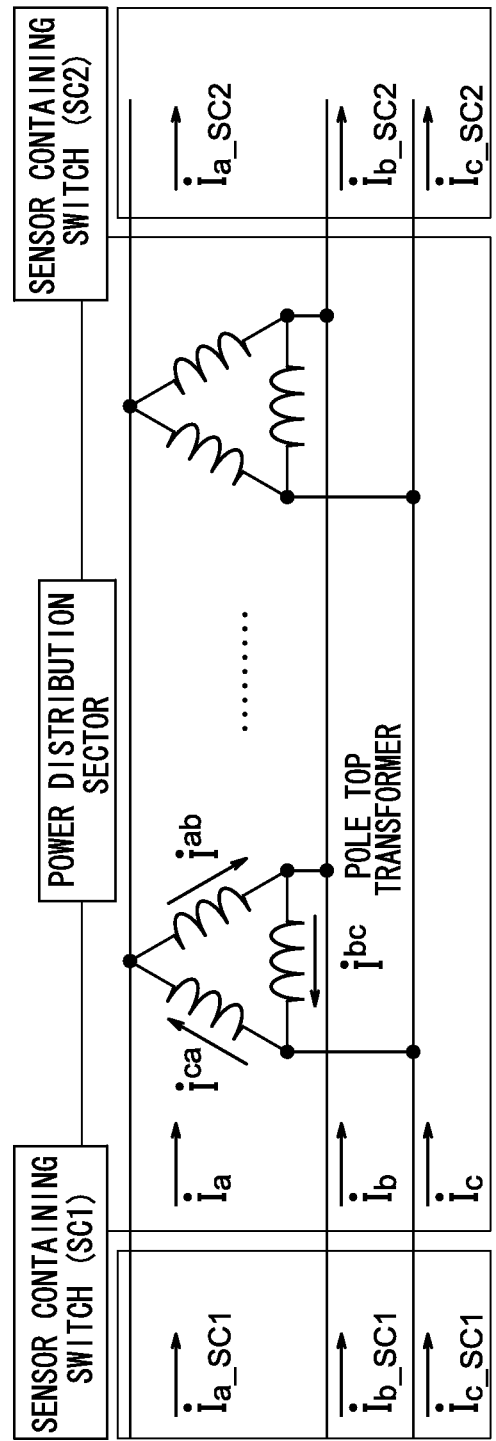
FIG. 3 is a schematic diagram representing a hypothetical circuit configuration of a power distribution system.

More specifically, for example, consider a power distribution system such as that illustrated in FIG. 3. The example in FIG. 3 is a three phase three line circuit, in which the transformers are three phase transformers that form hypothetical triangular connection. Most pole top transformers in actual power distribution systems employ a single phase three line system, and normally employ only a single phase; however, in FIG. 3, in order to be able to handle plural possibilities of connection phase, the power distribution system is illustrated as a hypothetical circuit configuration. In the present exemplary embodiment, the sector sandwiched between two sensor containing switches is annotated "power distribution sector". The consumer is connected to the secondary side of the transformer.

The correspondence relationship between power distribution sectors and the transformers belonging to the power distribution sectors, and the correspondence relationship between transformers and the consumers connected to the transformers, are stored as power distribution data in a power distribution data storage section 22. The consumer selection section 12 references power distribution data stored in the power distribution data storage section 22 and selects a power distribution sector and a consumer corresponding to the received transformer ID.

The current value computation section 14 reads time series data of power consumption of the selected consumer, converts the power consumption time series data into time series data of current values, and computes time series data of phase current caused by power consumption of the consumer. The power consumption time series data of the consumer may, for example, employ data measured by a power meter with communication functions, such as a smart meter, installed at the consumer. The power consumption of the consumer is measured over, for example, periods of 30 minutes, and is stored in the power consumption data storage section 24 as time series data of power consumption for each of the consumers.

The correlation coefficient computation section 16 computes a correlation coefficient between the time series data of line current in the selected power distribution sector, and the time series data of the phase current caused by power consumption of the consumer. The line current time series data may be derived from the current values measured by the sensor containing switches that define the two ends of the power distribution sector. In the present exemplary embodiment, as illustrated in FIG. 3, since a three phase line circuit is assumed, the correlation coefficient computation section 16 derives line current time series data for each line (a-line, b-line, and c-line) of the high voltage side of the power distribution system. Then the correlation coefficient computation section 16 computes three types of correlation coefficient between the time series data of phase current caused by the power consumption of the consumer, and the line current time series data of each of the lines a-line, b-line, and c-line.

The connection phase determination section 18 determines which phase the subject transformer is connected to on the high voltage side based on the 3 types of correlation coefficient computed by the correlation coefficient computation section 16. More detailed explanation regarding the determination method is given later.

The output processing section 20 processes the determination result by the connection phase determination section 18 for displaying on a display, or printing on a printer, or the like, and outputs the determination result.

Detailed description of the filter applicator 30 and the filter coefficient optimizer 34 is given later.

Explanation follows regarding the principles that enable the transformer connection phase to be determined based on the correlation coefficients between the line current time series data of each of the lines on the high voltage side of the power distribution system, and the phase current time series data caused by the power consumption of the consumer.

When power is consumed by the consumer connected to the secondary side of the transformer, phase current also flows on the primary side of the transformer. It is possible to measure the current flowing in each of the lines on the high voltage side using the sensor containing switches, as described above.

As illustrated in FIG. 3, the net (complex) line current $I(\bullet)_x$ flowing into one power distribution sector is defined as indicated in the first half of Equation (1) below. The relationship between each of the line currents $I(\bullet)_x$ and the phase current $I(\bullet)_i^y$ is expressed by the second half of Equation (1) below using Kirchhoff's law. $I(\bullet)$, represented in the equations by adding a dot ("•") above a letter ("I"), represents a complex number.

$$\begin{cases} \dot{I}_a = \dot{I}_{a\_SC1} - \dot{I}_{a\_SC2} \\ \dot{I}_b = \dot{I}_{b\_SC1} - \dot{I}_{b\_SC2} \\ \dot{I}_c = \dot{I}_{c\_SC1} - \dot{I}_{c\_SC2} \end{cases} \quad (1)$$

$$\begin{cases} \dot{I}_a = \dot{I}^{ab} - \dot{I}^{ca} = \sum_i \dot{I}_i^{ab} - \sum_k \dot{I}_k^{ca} \\ \dot{I}_b = \dot{I}^{bc} - \dot{I}^{ab} = \sum_j \dot{I}_j^{bc} - \sum_i \dot{I}_i^{ca} \\ \dot{I}_c = \dot{I}^{ca} - \dot{I}^{bc} = \sum_k \dot{I}_k^{ca} - \sum_j \dot{I}_j^{bc} \end{cases}$$

$$(1 \le i \le n_{ab}, 1 \le j \le n_{bc}, 1 \le k \le n_{ca})$$

Wherein $x \in \{a, b, c\}$ for $I(\bullet)_x$, and $I(\bullet)_x$ is the (complex) current flowing in line x on the high voltage side. $I(\bullet)_{x\_SC1}$ and $I(\bullet)_{x\_SC2}$ are current values measured at each of the respective sensor containing switches disposed at the two ends of line x. $y \in \{ab, bc, ca\}$ for $I(\bullet)^y$, and $I(\bullet)^y$ is the phase current of the y phase of the transformer. $y \in \{ab, bc, ca\}$ for $I(\bullet)_i^y$, and $I(\bullet)_i^y$ is the phase current of the y phase caused by the power consumption of the $i^{th}$ consumer. $n_y$ is the number of consumers connected to the y phase.

As can be seen from Equation (1), in the circuit illustrated in FIG. 3, there is a 1 to 2 relationship between the phase current of the transformer and the line current of the power distribution line, and the power consumption of the consumer influences two lines out of the three power distribution lines. Even in cases in which the consumer is connected to a transformer connected to one of the phases, one line out of two lines is redundant, and so the power data is not independent between the high voltage side and the low voltage side (consumer side), and so connection phase determination by correlation analysis is not appropriate.

In contrast thereto, for current, a phase current and a line current are independently present as a combination. For example, it can be seen from Equation (1) that the phase current $I(\bullet)_i^{ab}$ of the ab-phase caused by power consumption of a consumer connected to the ab-phase is unrelated to the line current $I(\bullet)_c$. There are also similar independent combinations present for the relationships between the other phase currents and line currents. It is accordingly possible to determine the transformer connection phase as long as the differences in such correlation can be estimated by statistical analysis. Explanation next follows regarding determination of transformer connection phase by correlation analysis using current data.

As stated above, the high voltage side of the power distribution system is configured by a three phase three line system with a phase difference of $2\pi/3$ between each of the phase currents. If the latter part of Equation (1) is expressed by phase current broken down into amplitude and phase, this results in the following Equation (2).

$$\dot{I}_a = \sum_i I_i^{ab} - e^{j\frac{2}{3}\pi} \sum_k I_k^{ca} \quad (2)$$

$$\dot{I}_b = e^{-j\frac{2}{3}\pi} \sum_j I_j^{bc} - \sum_j I_j^{ab}$$

$$\dot{I}_c = e^{j\frac{2}{3}\pi} \sum_k I_k^{ca} - e^{-j\frac{2}{3}\pi} \sum_j I_j^{bc}$$

$$I_x = |\dot{I}_x|, x \in \{a, b, c\}$$

$$I_i^y = |\dot{I}_i^y|, y \in \{ab, bc, ca\}$$

The amplitude of the phase current may be obtained by adding the real component values for a given phase, and so may be compiled by following Equation (3).

$$I^y = \left|\sum_i \dot{I}_i^y\right| \quad (3)$$

$$= \left|\sum_i I_i^y\right|$$

$$= \sum_i I_i^y$$

The following Equation (4) uses Equation (2) and Equation (3) and expresses the amplitude of the line current of the a-line as phase current.

$$I_a = |\dot{I}_a| \quad (4)$$

$$= \left|\sum_i I_i^{ab} - e^{-j\frac{2}{3}\pi} \sum_k I_k^{ca}\right|$$

Assuming the power distribution system has symmetrical three phase alternating current, then the amplitude of the line current of the a-line is expressed by following Equation (5). Note that symmetrical three phase alternating current has equal electromotive force and frequency for the three phases, and the phase differences are all $2\pi/3$.

$$I_a = \sqrt{(I^{ab})^2 + (I^{ca})^2 - 2I^{ab}I^{ca}\cos\frac{2\pi}{3}} \quad (5)$$

$$= \sqrt{(I^{ab})^2 + (I^{ca})^2 + I^{ab}I^{ca}}$$

Taking the first order Taylor expansion approximation of Equation (5), the relationship of infinitesimal changes in the line current of the a-line, with infinitesimal changes in the phase current of ab-phase and the phase current of ca-phase can be expressed by the following Equation (6).

$$dI_a \sim \frac{2I^{ab} + I^{ca}}{2\sqrt{(I^{ab})^2 + (I^{ca})^2 + I^{ab}I^{ca}}} dI^{ab} + \frac{2I^{ca} + I^{ab}}{2\sqrt{(I^{ab})^2 + (I^{ca})^2 + I^{ab}I^{ca}}} dI^{ca} \quad (6)$$

Moreover, assuming the load impedance connected to each phase has the same equilibrium load, then since $I^{ab} = I^{ca}$, a linear approximation is obtained as the following Equation (7) for the infinitesimal change from a state of equilibrium.

$$dI_a \sim \frac{\sqrt{3}}{2} dI^{ab} + \frac{\sqrt{3}}{2} dI^{ca} \quad (7)$$

Since it is possible to make similar approximations for the other line currents, the infinitesimal changes in line current can be estimated by the 3 approximations of the following Equation (8).

$$\begin{cases} dI_a \sim \frac{\sqrt{3}}{2}(dI^{ab} + dI^{ca}) \\ dI_b \sim \frac{\sqrt{3}}{2}(dI^{bc} + dI^{ab}) \\ dI_c \sim \frac{\sqrt{3}}{2}(dI^{ca} + dI^{bc}) \end{cases} \quad (8)$$

In order to apply correlation analysis to current data, time series data of line current $I_x(t)$, and time series data of phase current $I_d^y(t)$ is defined by the following Equation (9-1). In Equation (9-1), values expressing displacement from the time averages of measurement values $I_x'(t)$ of the line current, and measurement values $I'^y_d(t)$ of the phase current are respectively employed as $I_x(t)$, and $I_d^y(t)$.

$$I_x(t) = I'_x(t) - \mu(I'_x(t)), x \in \{a,b,c\}$$

$$I_d^y(t) = I'^y_d(t) - \mu(I'^y_d(t)), y \in \{ab, bc, ca\} \quad (9-1)$$

($\mu(\bullet)$ is the time average)

For a given phase, the amplitude of the line current may be treated as a real number when deriving the net line current $I_x'(t)$ flowing in each power distribution sector as illustrated in FIG. 3 from measurement values of the sensor containing switches. Then, as in the following Equation (9-2), the line current $I_x'(t)$ is obtained by subtracting the measurement value in the downstream sensor containing switch (SC2) from the measurement value in the upstream sensor containing switch (SC1).

$$I'_x(t) = I'_{x\_SC1}(t) - I'_{x\_SC2}, x \in \{a,b,c\} \quad (9\text{-}2)$$

In Equation (9-1), the phase current $I'^y_d(t)$ caused by power consumption of the consumer d connected to phase y of the transformer may be computed from the amount of power consumption measured by the power meter using the following Equation (10). In such cases, the contracted voltage is employed as a constant for the voltage value. The current value computed from the power consumption of the consumer measured by the power meter and from the contracted voltage (effective value) is an effective value, and so is expressed in terms of $\sqrt{2}$ to derive the amplitude (maximum value) in Equation (10). The current value computed in Equation (10) only has the meaning of the average current amount over the sampling interval of the power meter; however there is no problem in implementing statistical analysis as long as the line current is also subjected to equivalent processing.

$$I'^y_d(t) = \frac{\sqrt{2}}{k} \cdot \frac{P_d(t)}{V_d} \quad (10)$$

$P_d(t)$ is the time series data of power consumption of the consumer d, $V_d$ is the contracted voltage (effective value) of consumer d, and k is the transformer ratio.

The covariance $\sigma^y_{x,d}$ and the correlation coefficient $\rho^y_{x,d}$ between the time series data of each line current $I_x(t)$ and the time series data of each phase current $I'^y_d(t)$ may be defined by the following Equation (11). Although Equation (10) is employed as the definition of the phase current caused by power consumption of the consumer d in the explanation below, $P_d(t)$ may be employed as is in place of $I'^y_d(t)$ in Equation (10) since the same result is obtained even when a constant factor is ignored in the calculation of the correlation coefficient and the like.

$$\sigma^y_{x,d} = \frac{1}{T}\sum_{t=1}^{T} I_x(t) I^y_d(t) \quad (11)$$

$$\rho^y_{x,d} = \frac{\sigma^y_{x,d}}{\sigma_x \sigma^y_d} = \frac{\frac{1}{T}\sum_{t=1}^{T} I_x(t) I^y_d(t)}{\sqrt{\frac{1}{T}\sum_{t=1}^{T} I_x(t)^2} \sqrt{\frac{1}{T}\sum_{t=1}^{T} I^y_d(t)^2}}$$

$$(-1 \le \rho^y_{x,d} \le 1)$$

Wherein $\sigma_x$ is the deviation in $I_x(t)$, $\sigma^y_d$ is the deviation in $I'^y_d(t)$, and T is the number of sampling points in the time series data.

There are 3×3=9 correlation coefficients and covariances defined in Equation (11) by combining the subscripts x and y. The specific values held by these correlation coefficients are determined by changes with time in the power consumption of each of the consumers, and how the transformer connection phases that define the relationship between the line current and the phase current are set.

Explanation follows regarding values of correlation coefficients when appropriate assumptions are made for the time series data of power consumption. Application of Equation (8) enables the time series data of values of each of the line currents to be approximated by the following Equation (12).

$$\begin{cases} I_a(t) \sim \frac{\sqrt{3}}{2}\left(\sum_i I^{ab}_i(t) + \sum_k I^{ca}_k(t)\right) \\ I_b(t) \sim \frac{\sqrt{3}}{2}\left(\sum_j I^{bc}_j(t) + \sum_i I^{ab}_i(t)\right) \\ I_c(t) \sim \frac{\sqrt{3}}{2}\left(\sum_k I^{ca}_k(t) + \sum_j I^{bc}_j(t)\right) \end{cases} \quad (12)$$

$$I^y_i(t) = I'^y_i(t) - \mu(I'^y_i(t)), \, y \in \{ab, bc, ca\}$$

($\mu(\bullet)$ is the time average)

Assume the phase current $I^y_i(t)$ caused by power consumption by each of all the consumers including consumer d follow mutually independent normal distributions N (0, $\sigma_0^2$). First, the deviation $\sigma_x$ in the time series data of each of the line currents $I_x(t)$, and the covariance $\sigma^{ab}_{x,d}$ between the line current $I_x(t)$ and the phase current $i^{ab}_d(t)$ in cases in which the consumer d is connected to the ab-phase, are given by the following Equation (13), derived from Equation (11) and Equation (12).

$$\begin{cases} \sigma_a \sim \frac{\sqrt{3}}{2} \cdot \sqrt{n_{ab} + n_{ca}} \cdot \sigma_0 \\ \sigma_b \sim \frac{\sqrt{3}}{2} \cdot \sqrt{n_{bc} + n_{ab}} \cdot \sigma_0 \\ \sigma_c \sim \frac{\sqrt{3}}{2} \cdot \sqrt{n_{ca} + n_{bc}} \cdot \sigma_0 \end{cases} \quad (13)$$

$$\begin{cases} \sigma^{ab}_{a,d} = \frac{1}{T}\sum_{t=1}^{T} I_a(t) I^{ab}_d(t) \sim \frac{1}{T}\sum_{t=1}^{T}\left[\frac{\sqrt{3}}{2}\left(\sum_i I^{ab}_i(t) + \sum_k I^{ca}_k(t)\right) I^{ab}_d(t)\right] \\ \quad = \frac{\sqrt{3}}{2}\sigma_0^2 \\ \sigma^{ab}_{b,d} = \frac{1}{T}\sum_{t=1}^{T} I_b(t) I^{ab}_d(t) \sim \frac{1}{T}\sum_{t=1}^{T}\left[\frac{\sqrt{3}}{2}\left(\sum_j I^{bc}_j(t) + \sum_i I^{ab}_i(t)\right) I^{ab}_d(t)\right] \\ \quad = \frac{\sqrt{3}}{2}\sigma_0^2 \\ \sigma^{ab}_{c,d} = \frac{1}{T}\sum_{t=1}^{T} I_c(t) I^{ab}_d(t) \sim \frac{1}{T}\sum_{t=1}^{T}\left[\frac{\sqrt{3}}{2}\left(\sum_k I^{ca}_k(t) + \sum_j I^{bc}_j(t)\right) I^{ab}_d(t)\right] \\ \quad = 0 \end{cases}$$

The result of the latter part in Equations (13) is obtained from the fact that, out of each of the line currents, the phase current $I^{ab}_d(t)$ of the ab-phase caused by power consumption of the consumer d correlates only to the portion caused by its own phase current. If the result is substituted into the definition of the correlation coefficient, then in a case in which the consumer d is connected to ab-phase, the correlation coefficient between each of the line currents and the phase current of the ab-phase can be derived as indicated in the following Equation (14).

$$\begin{cases} \rho_{a,d}^{ab} = \dfrac{\sigma_{a,d}^{ab}}{\sigma_a \sigma_d^{ab}} \sim \dfrac{\dfrac{\sqrt{3}}{2}\sigma_0^2}{\left(\dfrac{\sqrt{3}}{2}\cdot\sqrt{n_{ab}+n_{ca}}\cdot\sigma_0\right)\cdot\sigma_0} = 1/\sqrt{n_{ab}+n_{ca}} \\[1em] \rho_{b,d}^{ab} = \dfrac{\sigma_{b,d}^{ab}}{\sigma_b \sigma_d^{ab}} \sim \dfrac{\dfrac{\sqrt{3}}{2}\sigma_0^2}{\left(\dfrac{\sqrt{3}}{2}\cdot\sqrt{n_{bc}+n_{ab}}\cdot\sigma_0\right)\cdot\sigma_0} = 1/\sqrt{n_{bc}+n_{ab}} \\[1em] \rho_{c,d}^{ab} = \dfrac{\sigma_{c,d}^{ab}}{\sigma_c \sigma_d^{ab}} \sim 0 \end{cases} \quad (14)$$

Similar computations are also possible for cases in which the consumer d is connected to the other phases. The following Equations (15) are approximations for the correlation coefficients between each of the line currents and phase currents by connection phase of the consumer d.

$$\begin{aligned} \rho_{a,d}^{y} &\sim \begin{cases} 1/\sqrt{n_{ab}+n_{ca}} & (y=ab, ca) \\ 0 & (y=bc) \end{cases} \\ \rho_{b,d}^{y} &\sim \begin{cases} 1/\sqrt{n_{bc}+n_{ab}} & (y=ab, bc) \\ 0 & (y=ca) \end{cases} \\ \rho_{c,d}^{y} &\sim \begin{cases} 1/\sqrt{n_{ca}+n_{bc}} & (y=bc, ca) \\ 0 & (y=ab) \end{cases} \end{aligned} \quad (15)$$

As illustrated in Equation (15), there is a one-to-one correspondence between the transformer connection phase to which the consumer d is connected, and type of correlation coefficient that approximates to a value of 0. The correlation coefficients that do not have a value approximating to 0 hold values dependent on the distribution of each of the connection phases for all the consumers.

Up to now calculation has proceeded on the assumption that there is a single consumer d; however, when there is usable data for power consumption for plural consumers connected to the same transformer, it is possible to improve the precision of determination of the transformer connection phase.

Specifically, the total consumed power amount is acquired for each of the consumers for every measurement time, enabling an improvement to be achieved in the determination precision of the transformer connection phase by treating the acquired total as consumed power for a large hypothetical consumer. For example, take a case in which it is possible, for example, to use time series data for power consumption of consumers for $n_d$ households. Moreover, the distribution of phase current caused by the power consumption of this hypothetical consumer follows a normal distribution of N (0, $n_d \sigma_0^2$). In such cases, the approximations of correlation coefficient may be rewritten as in the following Equations (16), in which the difference in the correlation coefficients changes in proportion to the $n_d$.

$$\rho_{a,d}^{y} \sim \begin{cases} \sqrt{\dfrac{n_d}{n_{ab}+n_{ca}}} & (y=ab, ca) \\ 0 & (y=bc) \end{cases} \quad (16)$$

$$\rho_{b,d}^{y} \sim \begin{cases} \sqrt{\dfrac{n_d}{n_{bc}+n_{ab}}} & (y=ab, bc) \\ 0 & (y=ca) \end{cases}$$

$$\rho_{c,d}^{y} \sim \begin{cases} \sqrt{\dfrac{n_d}{n_{ca}+n_{bc}}} & (y=bc, ca) \\ 0 & (y=ab) \end{cases}$$

The actual phase current is not limited to one with a normal distribution such as is assumed above. However similarly, even in general cases, the line corresponding to the one correlation coefficient present, out of the three types of correlation coefficient, having a smaller value compared to the others corresponds to the connection phase of the transformer. Focusing on this fact enables the correlation coefficients of the time series data of the line current for each of the lines on the high voltage side of the power distribution system, against the time series data of the phase current caused by power consumption by the consumer, to be computed, and enables the transformer connection phase to which the consumer is detected to be determined by comparison therebetween.

Explanation follows regarding the precision of the transformer connection phase determination problem using correlation coefficients. In a three phase alternating current power distribution system, connection lines are generally employed so as to obtain a balance of load in the three phases in order to achieve good power transmission efficiency. If the total number of consumers of a power distribution sector subject to determination is N, then assume a relationship has been established in which $n_{ab}=n_{bc}=n_{ca}=N/3$. In such a case, the variation range of the correlation coefficients for each of the line currents given by Equation (16) is approximately as represented by following Equation (17). If Equation (17) is used as an index, then it is possible to estimate the difficulty of the determination problem according to the conditions of data employed.

$$\Delta \rho \sim \sqrt{\dfrac{3n_d}{2N}} \quad (17)$$

Figure 4:
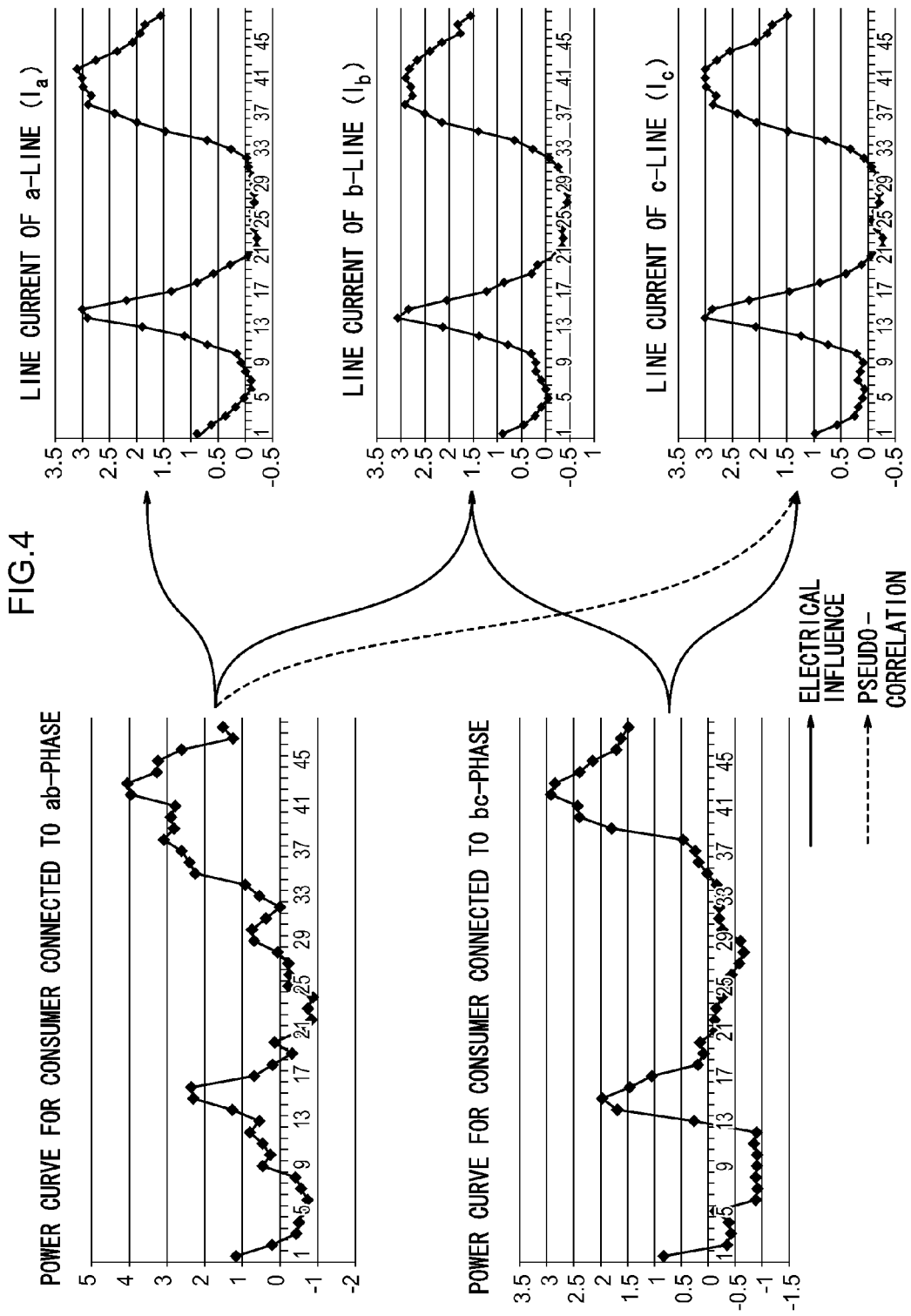
FIG. 4 is a diagram for explaining pseudo-correlation.

The correlation coefficient between the line current and the phase current explained above does not consider similarities in the power curve exhibited in the shape of the time series data of the power consumption. A daily cycle in the power consumption of a consumer is exhibited in the power curve measured in actuality. This daily cycle results in a pseudo-correlation between the line current and the phase current. A daily cycle of power consumption refers to the presence of a daily cycle, a half-day cycle from morning until evening, or the like of fluctuations in power consumption caused by the lifestyle pattern of many consumer households. For example, as illustrated in FIG. 4, over, for example, a daily cycle, or a half-day cycle, the power curve will have a similar profile regardless of the line the consumer is connected to.

Pseudo-correlations due to such daily cycles in the power consumption are irrelevant to the correlation based on electrical influences discussed in the present exemplary embodiment. Substantial similarity in the pseudo-correlation due to the daily cycle in the power consumption arises between the power curve of a consumer and all of the line currents, regardless of the connection phase of the consumer. For example, as illustrated in FIG. 4, the power curve of a consumer connected to the ab-phase of a transformer is in principle expected to have little correlation with the line current $I_c$ of the c-line. However, there is also a somewhat high correlation coefficient with the line current $I_c$ due to the pseudo-correlation arising between the power curve of a consumer connected to the ab-phase of the transformer, and the line current $I_c$, impacting the determination of the connected transformer phase.

In the present exemplary embodiment, a digital filter (DF) is applied to the time series data of the line current, and the time series data of the phase current caused by power consumption of consumers. This pseudo-correlation is thereby suppressed through signal processing, by utilizing the nature of the pseudo-correlation whose cycle is essentially known. A filter is accordingly applied to the time series data of the phase current and the time series data of the line current respectively, to attenuate low-frequency components representing the daily cycle of power consumption (for example, a daily cycle, a half-day cycle, or the like).

Figure 5:
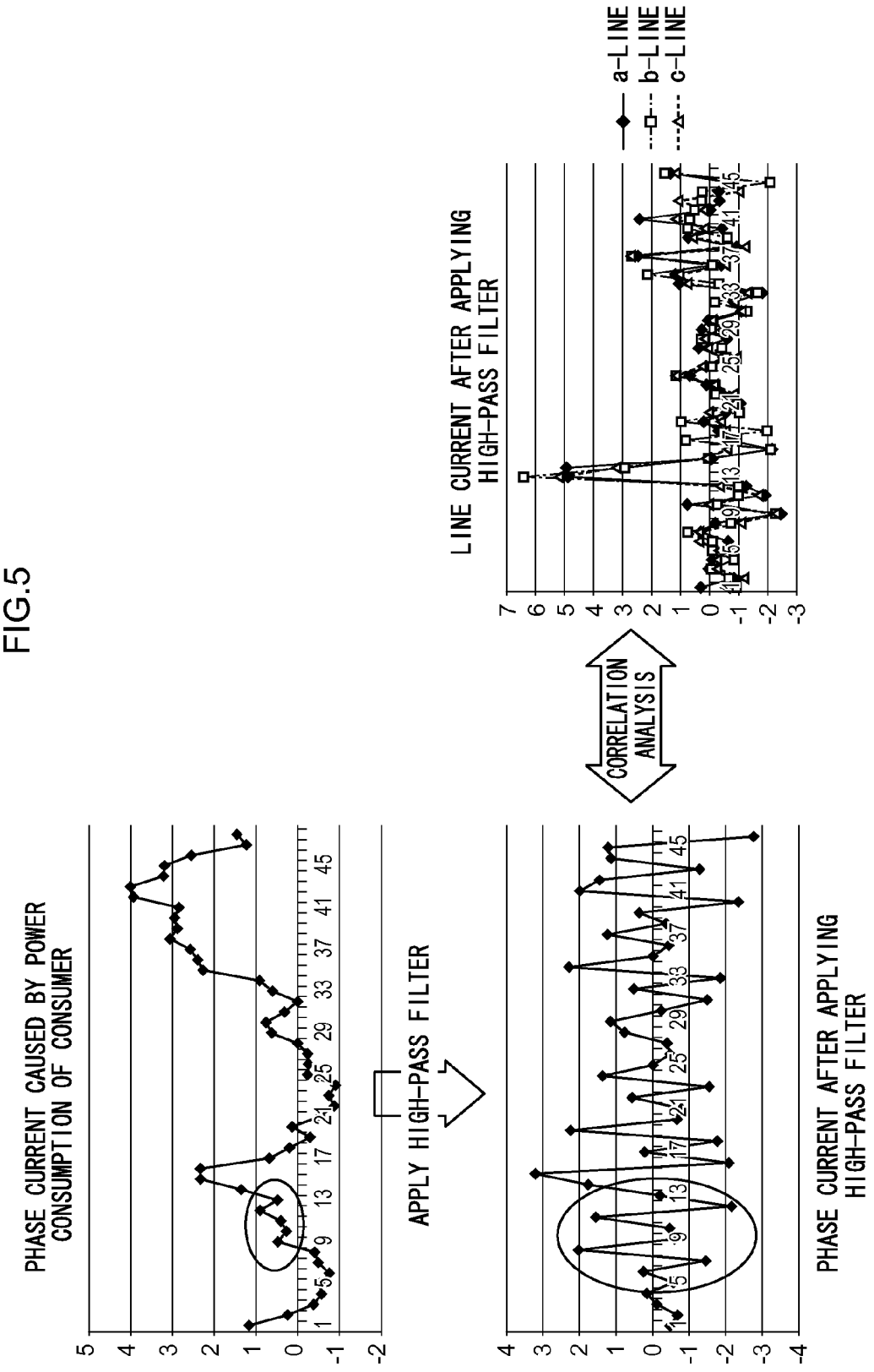
FIG. 5 is a diagram for explaining application of a high-pass filter.

For example, as illustrated in FIG. 5, a high-pass filter is applied to the time series data of the phase current and the time series data of the line current respectively. This thereby enables attenuation of the low frequency components in each time series data, unmasking of detailed fluctuations (high frequency components), and suppression of pseudo-correlation production. By performing the connection phase determination after application of a high-pass filter in this manner, determination precision is increased.

Although there are various types of applicable filter, a finite impulse response (FIR) filter such as a high-pass filter or a band pass filter is applied here. As indicated by Equation (18), due to applying an FIR filter, input time series data is output as output time series data on which integration has been performed according to a filter coefficient of the applied filter.

$$y(t_i) = \sum_{j=0}^{N} c_j x(t_{i-j}) \tag{18}$$

Wherein, $x(t_i)$ is input time series data, $y(t_i)$ is output time series data, $c_j$ is the filter coefficient, and $N$ is the filter order (there are N+1 taps).

FIR filters have a number of characteristic parameters, such as cutoff frequency, and filter order, that are to be set, and these characteristic parameters establish the filter coefficient. Equation (19) below represents an example of a high-pass filter that passes frequencies of $f_c$ or greater.

$$\begin{cases} c_0 = 1 - 2\Omega_c \\ c_n = (-1)^n \cdot 2\Omega_c \cdot \dfrac{\sin 2n\pi\Omega_c}{2n\pi\Omega_c} \\ c_{N/2+n} = c_{N/2-n} \end{cases} \tag{19}$$

$(n = 1, 2, \ldots, N/2)$ $$\Omega_c = \frac{f_c}{f_a}$$

Wherein, $\Omega_c$ is the normalized cutoff frequency, $f_c$ is the cutoff frequency, and $f_a$ is the sampling rate.

Equation (20) below represents an example of a band pass filter that allows frequencies of from $f_1$ to $f_2$ to pass.

$$\begin{cases} c_0 = 2(\Omega_2 - \Omega_1) \\ c_n = 2(\Omega_2 - \Omega_1) \cdot \cos(n\pi(\Omega_1 + \Omega_2)) \cdot \dfrac{\sin n\pi(\Omega_2 - \Omega_1)}{n\pi(\Omega_2 - \Omega_1)} \\ c_{N/2+n} = c_{N/2-n} \end{cases} \tag{20}$$

$(n = 1, 2, \ldots, N/2)$ $$\Omega_1 = \frac{f_1}{f_a}, \Omega_2 = \frac{f_2}{f_a} \quad (\Omega_1 < \Omega_2)$$

Wherein, $\Omega_1$ and $\Omega_2$ are normalized cutoff frequencies, $f_1$ and $f_2$ are cutoff frequencies ($f_1 < f_2$), and $f_a$ is the sampling rate. Although Equation (19) and Equation (20) represent examples in which the filter order is an even number, the filter order may be an odd number.

As is apparent from Equation (19) and Equation (20), supplying the cutoff frequency and the filter order that are characteristic parameters of the filter, enables the filter coefficient to be set automatically. Setting appropriate values for these characteristic parameters enables the precision of the transformer connection phase determination to be increased. However, what specific settings are appropriate for the values of the characteristic parameters is unclear a priori. Therefore, in the present exemplary embodiment, appropriate values are set for the characteristic parameters of the filter applied to the time series data of the line current and the time series data of the phase current caused by power consumption, and the filter coefficient is optimized. Explanation follows regarding principles of filter coefficient optimization in the present exemplary embodiment.

In the present exemplary embodiment, the correlation coefficients discussed above between the time series data of the phase current caused by the power consumption of the consumers, and the time series data of the three respective types of line current, are derived, and the connection phase of the transformer is determined from the type of correlation coefficient that is the smallest. These correlation coefficients are quantities that stochastically fluctuate in practice, and the statistical behavior thereof varies according to the actual data employed. Thus, depending on the quality of the data employed, it is possible for the type of correlation coefficient expected to be the smallest in principle to be larger than the others.

As an indicator of quality of the current time series data, a quantity based on the magnitude of the difference between the smallest correlation coefficient and the correlation coefficient having an intermediate value out of the three types of computed correlation coefficient is applied as a filter coefficient optimization indicator. The difference between the smallest correlation coefficient value and the intermediate value indicates the tolerance of the phase determination to stochastic fluctuations in the correlation coefficients. The filter coefficient is thereby optimized by deriving the filter coefficient based on the filter coefficient optimization indicator.

Equation (21) to Equation (23) below provide three types of example of filter coefficient optimization indicators. In Equation (21), $\alpha^d$ is the difference between the smallest value and the intermediate value out of the three types of correlation coefficients computed using the time series data of the phase current caused by power consumption of a given consumer d. In Equation (22), $\mu_\alpha$ is the average value of $\alpha^i$ computed for plural consumers i (i=1, 2, ..., M). In Equation (23), $\mu_\alpha/\sigma_\alpha$ is the average standard deviation of $\alpha^i$, and is an indicator of the S/N ratio. Equation (21) is a filter coefficient optimization indicator that can be employed for individual consumers, and Equation (22) and Equation (23) are filter coefficient optimization indicators that can be employed for groups of consumers.

$$\alpha^d = mid\{\rho_{a,d}, \rho_{b,d}, \rho_{c,d}\} - \min\{\rho_{a,d}, \rho_{b,d}, \rho_{c,d}\} \qquad (21)$$

$$\mu_\alpha = \frac{1}{M}\sum_{i=1}^{M} \alpha^i \qquad (22)$$

$$\mu_\alpha/\sigma_\alpha \left(\sigma_\alpha^2 = \frac{1}{M}\sum_{i=1}^{M}(\alpha^i - \mu_\alpha)^2\right) \qquad (23)$$

Wherein, mid {•} is a function that returns an intermediate value, and min{•} is a function that returns the minimum value. Moreover, $\rho_{x,d}$ (x∈{a,b,c}) is a correlation coefficient between the time series data of the phase current $I^y_d$ (y∈{ab, bc,ca}) caused by the power consumption of the consumer d represented by Equation (11), and the time series data of the line current $I_x$ (x∈{a,b,c}). Since the connection phase of the consumer is unknown at the stage of computing the correlation coefficients, the superscript variable y in Equation (11) is ignored. M is the number of consumers.

The filter applicator 30 applies a filter, defined by a filter coefficient stored in a filter coefficient storage section 32, to the time series data of the phase current caused by the power consumption of the consumers computed by the current value computation section 14. The filter applicator 30 applies a similar filter to each of the time series data of the line current read from a line current data storage section 26. The correlation coefficient computation section 16 accordingly computes the correlation coefficients between the time series data of the phase current to which a filter has been applied, and each of the time series data of the line current to which a filter has been applied.

The filter coefficient optimizer 34 causes the current value computation section 14, the filter applicator 30, and the correlation coefficient computation section 16 to function to compute each of the correlation coefficients in cases in which the respective filters, having characteristic parameters adjusted within a specific range, have been applied. The filter coefficient optimizer 34, for example, computes a filter coefficient optimization indicator, such as one of those represented by Equation (21) to Equation (23), using each of the computed correlation coefficients. The filter coefficient optimizer 34 defines the filter coefficient based on characteristic parameters at which the filter coefficient optimization indicator reaches a maximum, optimizes the filter coefficient, and stores the optimized filter coefficients in the filter coefficient storage section 32.

Figure 6:
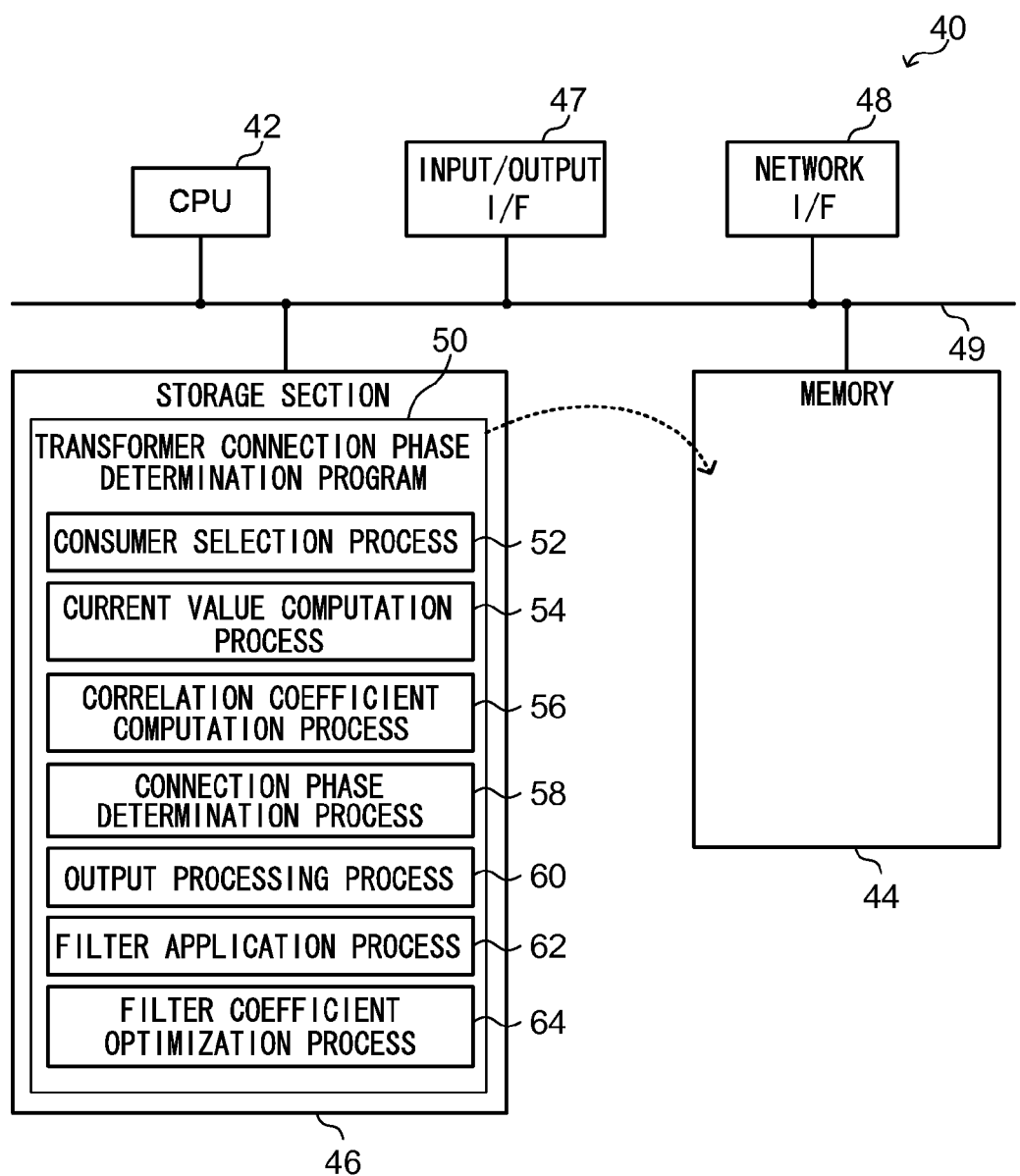
FIG. 6 is a block diagram illustrating a schematic configuration of a computer that functions as a transformer connection phase determination device according to an exemplary embodiment.

The transformer connection phase determination device 10 is capable of, for example, being implemented by a computer 40 as illustrated in FIG. 6. The computer 40 includes a CPU 42, memory 44, a non-volatile storage section 46, an input/output interface (I/F) 47, and a network I/F 48. The CPU 42, the memory 44, the storage section 46, the input/output I/F 47, and the network I/F 48 are connected together through a bus 49.

The storage section 46 may be implemented by a Hard Disk Drive (HDD), flash memory, or the like. A transformer connection phase determination program 50 to cause the computer 40 to function as the transformer connection phase determination device 10 is stored on the storage section 46 serving as a storage medium. The CPU 42 reads the transformer connection phase determination program 50 from the storage section 46, expands the transformer connection phase determination program 50 in the memory 44, and sequentially executes the processes of the transformer connection phase determination program 50.

The transformer connection phase determination program 50 includes a consumer selection process 52, a current value computation process 54, a correlation coefficient computation process 56, a connection phase determination process 58, an output processing process 60, a filter application process 62, and a filter coefficient optimization process 64. The CPU 42 operates as the consumer selection section 12 illustrated in FIG. 2 by executing the consumer selection process 52. The CPU 42 operates as the current value computation section 14 illustrated in FIG. 2 by executing the current value computation process 54. The CPU 42 operates as the correlation coefficient computation section 16 illustrated in FIG. 2 by executing the correlation coefficient computation process 56. The CPU 42 operates as the connection phase determination section 18 illustrated in FIG. 2 by executing the connection phase determination process 58. The CPU 42 operates as the output processing section 20 illustrated in FIG. 2 by executing the output processing process 60. The CPU 42 operates as the filter applicator 30 illustrated in FIG. 2 by executing the filter application process 62. The CPU 42 operates as the filter coefficient optimizer 34 illustrated in FIG. 2 by executing the filter coefficient optimization process 64. The computer 40 that executes the transformer connection phase determination program 50 accordingly functions as the transformer connection phase determination device 10.

Note that the transformer connection phase determination device 10 may be implemented with, for example, a semiconductor integrated circuit, and more specifically with an Application Specific Integrated Circuit (ASIC) or the like.

Operation of the Transformer Connection Phase Determination Device

Explanation follows regarding operation of the transformer connection phase determination device 10 according to the present exemplary embodiment. When a transformer ID, indicating a transformer subject to connection phase determination, has been input to the transformer connection phase determination device 10, the determination processing illustrated in FIG. 7 is executed in the transformer connection phase determination device 10.

Figure 7:
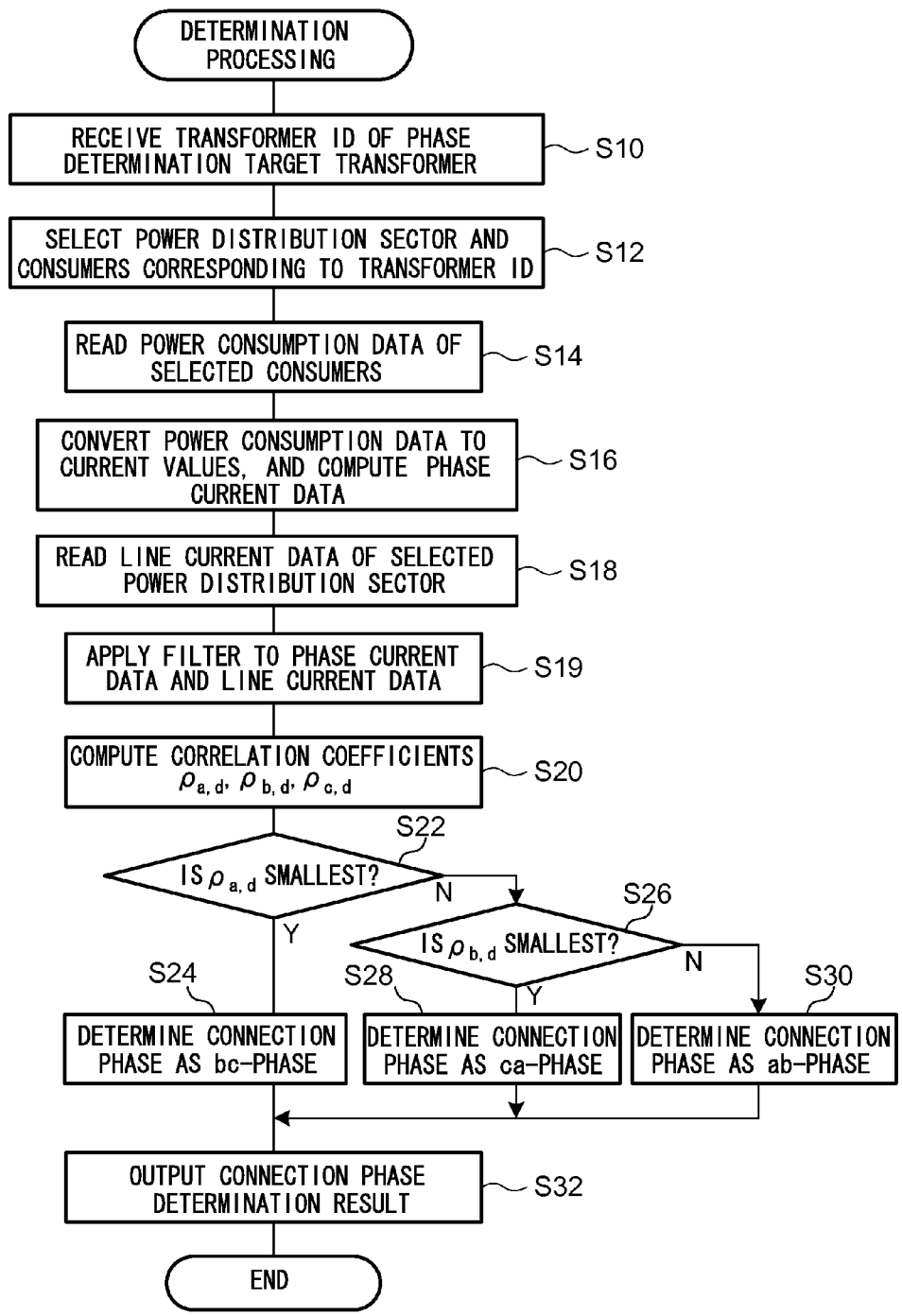
FIG. 7 is a flowchart illustrating an example of determination processing in an exemplary embodiment.

At step S10 of the phase determination processing illustrated in FIG. 7, the consumer selection section 12 receives the input transformer ID.

Then at step S12, the consumer selection section 12 selects the power distribution sector and consumers corresponding to the transformer ID received from the power distribution data storage section 22. A power distribution data table, for example such as that illustrated in FIG. 8, is stored in the power distribution data storage section 22. For each consumer, a consumer ID indicating the consumer, the transformer ID indicating the transformer to which the consumer is connected, and the power distribution sector ID indicating the power distribution sector to which the transformer belongs are stored associated to each other in the power distribution table of FIG. 8. In this case, as illustrated in FIG. 3, the power distribution system is envisaged as a power distribution system in which there are plural power distribution sectors, sandwiched between the sensor containing switches disposed at the upstream side and the downstream side of the power distribution system, all connected together in series. In such cases, for example, a power distribution sector ID indicating the power distribution sector sandwiched between the sensor containing switch (SC1) and the sensor containing switch (SC2) is defined as "I1-2". The power distribution data table of FIG. 8 includes a data availability flag indicating whether or not power consumption data for each of the consumers is usable. For example, if the power meter installed at the consumer, such as a smart meter, is connected through a network to the transformer connection phase determination device 10, then the power consumption data of that consumer is usable, and the data availability flag is set at "present".

The consumer selection section 12 thus selects the consumer ID and the power distribution sector ID corresponding to the transformer ID that matches the transformer ID received at step S10. Note that when the consumer ID is selected, consumer IDs with "present" as the data availability flag are selected. Plural consumer IDs are acquired if there are plural applicable consumer IDs present.

Then at step S14, the current value computation section 14 reads the power consumption data corresponding to the consumer ID selected at step S12 from the power consumption data storage section 24. A power consumption data table such as that illustrated in FIG. 9 is stored in the power consumption data storage section 24. The power consumption data table of FIG. 9 has amounts of power consumption (kWh) measured by a smart meter at fixed sampling time intervals (30 minutes in the example of FIG. 9) accumulated as time series data of power consumption for each consumer.

If a single consumer ID has been selected at step S12, then the power consumption data corresponding to that consumer ID may be read from the power consumption data table as is. For example, in the example of FIG. 8 and FIG. 9, if transformer ID=T1 is input, then since only consumer ID=d1 is selected, the power consumption data corresponding to consumer ID=d1 may be read from the power consumption data table as is.

Moreover, if plural consumer IDs have been selected at step S12, then plural sets of power consumption data corresponding to the plural consumer IDs are read. The power consumption amounts for each of the sampling times are then added together for the plural sets of power consumption data, and power consumption data is generated for a hypothetical consumer.

For example, in the example in FIG. 8 and FIG. 9, if transformer ID=T2 has been input, then the consumer IDs=d2, d3 are selected. Note that d4 is not selected since it has a data availability flag of "absent". The power consumption data corresponding to consumer ID=d2, and the power consumption data corresponding to consumer ID=d3, are then read from the power consumption data table. Then power consumption data for a hypothetical consumer, of the power consumption amount for "0:00"=0.65+0.51=1.16, and the power consumption amount for "0:30"=0.62+0.44=1.06, and so on, is generated. This thereby results in power consumption data with an improved S/N ratio, compared to employing power consumption data corresponding to each individual consumer ID without further processing, and raises the precision of correlation coefficient computed in later stage processing.

Then at step S16, the current value computation section 14 converts the power consumption data read at step S14, or the generated hypothetical consumer power consumption data, into current values using Equation (10). This current value corresponds to the time series data of the phase current caused by the power consumption of the selected consumers.

Next, at step S18, the correlation coefficient computation section 16 reads, from the line current data storage section 26, the three types of line current in the power distribution sector indicated by the power distribution sector ID selected at step S12. A line current data table, like that illustrated in FIG. 10 for example, is stored in the line current data storage section 26. The line current data table of FIG. 10 has a net current value [A] measured at fixed sampling time intervals (30 minutes in the example of FIG. 10) accumulated as time series data of line current for each of the a-line, the b-line, and the c-line of the power distribution sector indicated by the power distribution sector ID. The current values of the line currents may employ current values measured by the sensor containing switches disposed at the two ends of the power distribution sector, and may employ values computed according to Equation (9-2).

Next, at step S19 the filter applicator 30 applies the filter defined by the filter coefficient stored in the filter coefficient storage section 32 to the time series data of the phase current caused by the power consumption of the consumers computed at step S16. The filter applicator 30 applies similar filters to each of the time series data of the line currents read from the line current data storage section 26 at step S18.

Next, at step S20, the correlation coefficient computation section 16 employs the time series data of the phase current to which the filter was applied at step S18, and each of the time series data of the line current to which the filter was applied at S18, and computes the three types of correlation coefficient indicated in Equation (11). Since the connection phase of the consumer is still unknown, the superscript variable y of Equation (11) is ignored. More specifically, the time series data of the phase current caused by the power consumption of the consumer is taken as $I'_d(t)$ of Equation (10), and the time series data of the three types of line current are taken as $I'_x(t)$ of Equation (9-2), where x∈{a, b, c}. Since $I_d(t)$, $I_x(t)$, where x∈{a, b, c} can be computed as a displacement from the average values of Equation (9-1), the correlation coefficients $\rho_{a,d}, \rho_{b,d},$ and $\rho_{c,d}$ are computed by substituting $I_d(t)$, $I_x(t)$, where x∈{a, b, c}, into Equation (11).

Then at step S22, the connection phase determination section 18 determines whether or not the correlation coefficient $\rho_{a,d}$ is the minimum out of the three types of correlation coefficient computed at step S20. If the correlation coefficient $\rho_{a,d}$ is the minimum, then processing transitions to step S24, and if the correlation coefficient $\rho_{a,d}$ is not the minimum, then processing transitions to step S26. At step S24, the connection phase determination section 18 determines that the connection phase of the transformer indicated by the transformer ID received at step S10 is the bc-phase.

At step S26, determination is made as to whether or not the correlation coefficient $\rho_{b,d}$ is the minimum out of the three types of correlation coefficient computed at step S20. Processing transitions to step S28 if the correlation coefficient $\rho_{b,d}$ is the minimum, and processing transitions to step S30 if the correlation coefficient $\rho_{b,d}$ is not the minimum. At step S28, the connection phase determination section 18 determines that the connection phase of the transformer indicated by the transformer ID received at step S10 is the ca-phase.

If processing has transitioned to step S30, namely if negative determination has been made at step S22 and step S26, then, since the correlation coefficient $\rho_{c,d}$ is the minimum, the connection phase determination section 18 determines that the connection phase of the transformer indicated by the transformer ID received at step S10 is the ab-phase.

Then, at step S32, the output processing section 20 processes the determination result of step S24, S28 or S30, for displaying on a display, or printing on a printer, or the like, and outputs the determination result. The determination result of step S24, S28 or S30 is made according to Equation (15).

Figure 11:
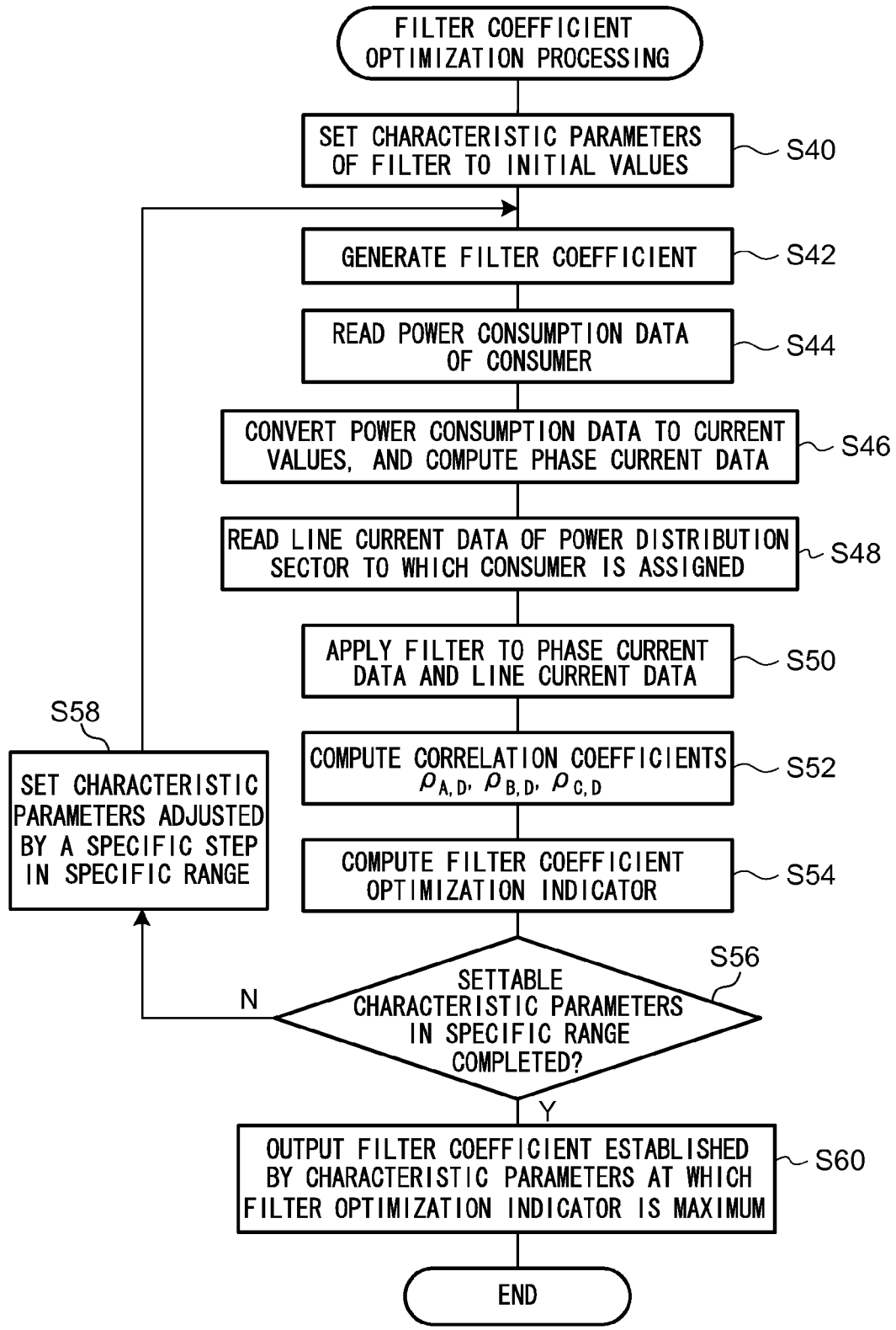
FIG. 11 is a flowchart illustrating an example of filter coefficient optimization processing in an exemplary embodiment.

Explanation next follows with reference to FIG. 11 regarding filter coefficient optimization processing performed prior to the above determination processing.

At step S40 of the filter coefficient optimization processing illustrated in FIG. 11, the filter coefficient optimizer 34 sets the cutoff frequency and the filter order, these being characteristic parameters of the filter, to initial values. In the filter coefficient optimization processing, for example, each frequency of specific frequencies (each being a specific step apart) in a range of from frequency f1 to f2 (f1<f2) may be taken as a frequency settable as the cutoff frequency that is a characteristic parameter. The filter order that is a characteristic parameter may also be set to a fixed value, or may be set to plural values. Accordingly, any settable characteristic parameter within the specific range may be set as the initial value of the characteristic parameter. Explanation follows regarding a case in which the initial value of the cutoff frequency is set to f1, and the filter order is set to N (a fixed value).

Next, at step S42 the filter coefficient optimizer 34 uses the characteristic parameter set at step S40 to, for example, generate the filter coefficient using Equation (19) or Equation (20).

Next, at step S44 the filter coefficient optimizer 34 causes the current value computation section 14 to function, and the power consumption data of the selected consumer is read from the power consumption data storage section 24. The consumer may be freely selected, and may, for example, be selected randomly, or, if the transformer that is the connection phase determination target is known, selection may be made from consumers connected to that transformer. The number of selected consumers may be one, or may be plural.

Next, at step S46 the filter coefficient optimizer 34 causes the current value computation section 14 to function, the power consumption data read at step 44 is converted using Equation (10), and the time series data of the phase current caused by power consumption of the consumer is computed.

Next, at step S48 the filter coefficient optimizer 34 causes the filter applicator 30 to function, and the three types of line current in the power distribution section to which the transformer, connected to the consumer selected at step S44, is assigned are read from the line current data storage section 26.

Next, at step S50 the filter coefficient optimizer 34 causes the filter applicator 30 to function, and the filter defined by the filter coefficient generated at step S42 is applied to the time series data of the phase current caused by the power consumption of the consumer computed at step S46. The filter coefficient optimizer 34 causes the filter applicator 30 to function, and similar filters are applied to each of the time series data of the line current read at step S48.

Next, at step S52 the filter coefficient optimizer 34 causes the correlation coefficient computation section 16 to function. More specifically, the correlation coefficient computation section 16 computes each of the three types of correlation coefficient indicated in Equation (11), $\rho_{a,d}$, $\rho_{b,d}$, $\rho_{c,d}$ using the time series data of the phase current to which the filter was applied at step S50, and each of the time series data of the line current to which the filters were applied.

Next, at step S54 the filter coefficient optimizer 34 computes the filter coefficient optimization indicator using the correlation coefficient computed at step S52. When one consumer was selected at step S44, the filter coefficient optimization indicator may, for example, be computed as the filter coefficient optimization indicator represented by Equation (21). When plural consumers were selected, computation of the filter coefficient optimization indicator represented by Equation (22) or Equation (23) may be made.

Next, at step S56 the filter coefficient optimizer 34 determines whether or not processing to set and generate filter coefficients for all of the settable characteristic parameters present within the specific range has ended. When there is a characteristic parameter present within the specific range that has not yet been set, processing transitions to step 58.

At step S58, the filter coefficient optimizer 34 sets a characteristic parameter, adjusted by a specific step, within the specific range, and processing returns to step S42. Here, the filter order is fixed at N, and the cutoff frequency is changed step-wise at specific steps within the range of f1 to f2 (for example, at steps of $\Delta f$). Since the setting of the cutoff frequency is currently at the initial value of f1, the cutoff frequency is set to f1+$\Delta f$ here.

When determination is made at step S56 that setting of all of the settable characteristic parameters present within the specific range has ended, processing transitions to step S60. At step S60, the filter coefficient optimizer 34 optimizes the filter coefficient by establishing as the filter coefficient, the characteristic parameter that gave the maximum value out of the filter coefficient optimization indicators computed for each characteristic parameter adjustment at step S54. The filter coefficient optimizer 34 outputs the optimized filter coefficient, and stores the optimized filter coefficient in the filter coefficient storage section 32, and filter coefficient optimization processing ends.

As explained above, according to the transformer connection phase determination device 10 according to the present exemplary embodiment, a filter that causes attenuation of low frequency components is applied to the line current of each of the power distribution lines at the high voltage side of the power distribution system, and the phase current caused by power consumption of the consumers connected to the transformer respectively. Then, the correlation coefficient between the line current and the phase current is computed after filter application. The correlation coefficient is computed for the line currents of each line type, and even if only some of the consumers have usable data for power consumption, the one correlation coefficient present that has a smaller value compared to the others corresponds to the connection phase of the transformer. Hence even in cases in which there is only usable data for power consumption for some of the consumers connected to the transformer, determination of the connection phase of the transformer is still possible.

Computing the correlation coefficient between the line current and the phase current after filter application enables generation of pseudo-correlation between the line current and the phase current due to the daily cycle of power consumption to be suppressed, enables a correlation of high precision to be computed, and enables determination precision to be increased for the transformer connection phase.

Figure 12:
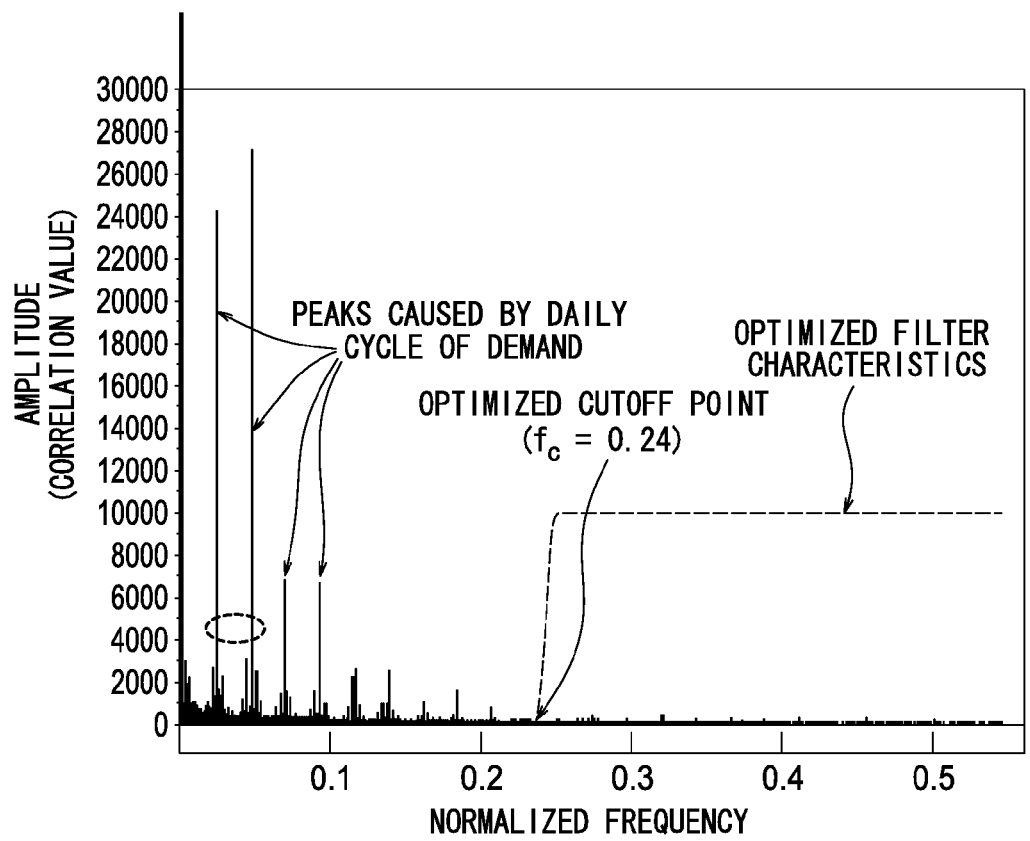
FIG. 12 is a diagram illustrating an example of a frequency spectrum of time series data of line current.

Optimization the filter coefficient of the applied filter so as to maximize the filter coefficient optimization indicator based on the difference between the correlation coefficients having the smallest value and the intermediate value, enables an increase in determination precision of the transformer connection phase. For example, as illustrated in FIG. 12, the frequency spectrum of the time series data of the line current exhibits a peak in the low frequency region due to the daily cycle of power consumption. When the filter coefficient is set intuitively, without performing optimization of the filter coefficient, as indicated by the dashed line ellipse in FIG. 12, it may be possible to set a cutoff frequency that can cut out peaks of daily cycles and half-day cycles. However, performing the filter coefficient optimization of the present exemplary embodiment enables a cutoff frequency to be derived as a higher frequency than an intuitive cutoff frequency. Namely, performing optimization of the filter coefficient in the present exemplary embodiment enables more appropriate setting of a cutoff frequency that can increase determination precision of the transformer connection phase than with an intuitively set cutoff frequency.

Figure 13:
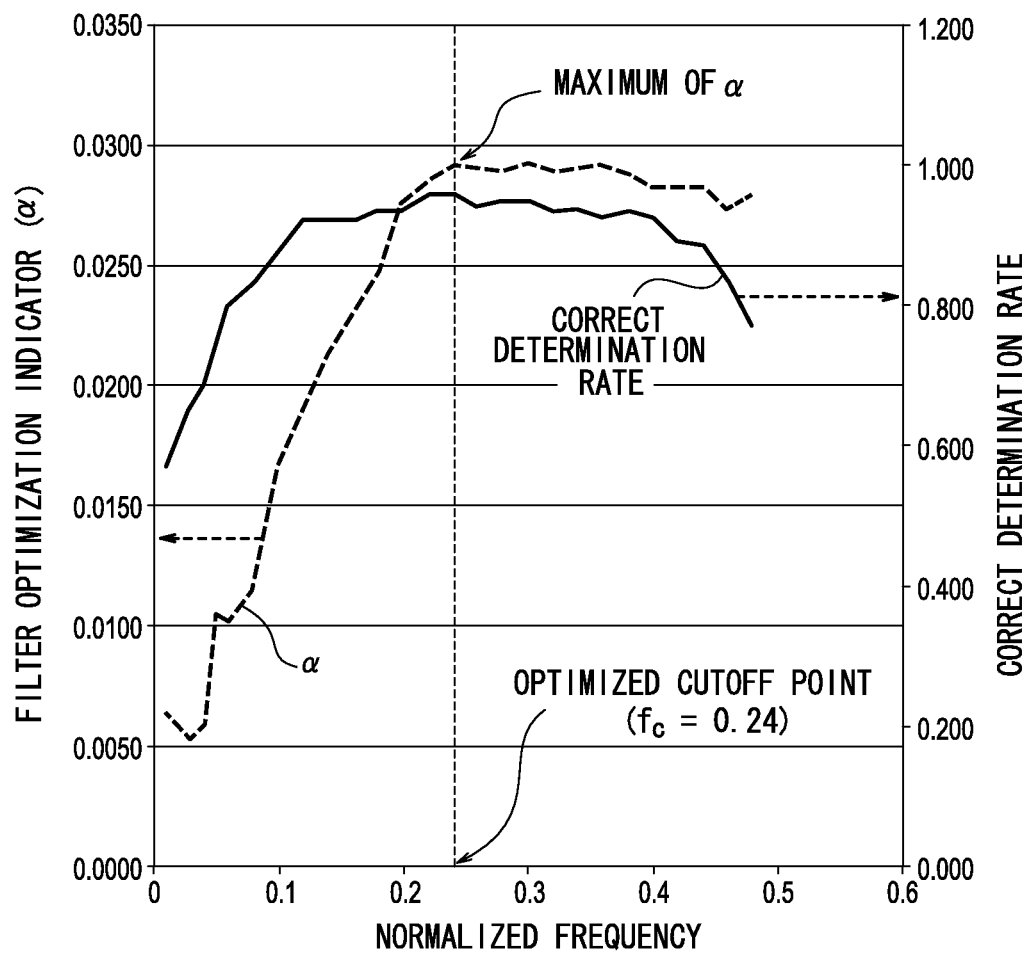
FIG. 13 is a diagram illustrating an example of a filter optimization indicator computed while changing a cutoff frequency, and a correct determination rate.

FIG. 13 illustrates a filter optimization indicator (a) computed while changing the cutoff frequency, and a correct determination rate for the determination results of the transformer connection phase when a filter having a filter coefficient, defined for each changed cutoff frequency, is applied, with the filter order fixed (N=250). As illustrated in FIG. 13, a high correct determination rate is obtained when the applied filter has a cutoff frequency determined based on the maximum of α.

The data of the line current of each of the power distribution lines on the high voltage side of the power distribution system can be derived from the measurement values measured by the sensor containing switches. The data of power consumption of the consumers may employ measurement values measured by power meters with communication functions, such as smart meters, installed at the consumer. The connection phase of the transformer is thereby determinable by using merely the data measured by the sensor containing switches and the power meters with communication functions.

The correlation coefficients expressed by Equation (11) are merely an example thereof, and other values that are values indicating the correlation between the phase current and the line current may also be employed.

Although explanation has been given above of a case in which the filters are applied after power consumption data of consumers has been converted to current values, filters may be applied to power consumption data, and the power consumption data post-filter application may be converted to current values.

Explanation has been given above of a case in which the transformer connection phase determination program 50 is pre-stored (installed) in the storage section 46, however the transformer connection phase determination program 50 may be supplied in another format recorded on a recording medium such as a CD-ROM, or a DVD-ROM.

An aspect exhibits the advantageous effect of enabling a connection phase of a transformer to be determined even in cases in which there is only usable data on power consumption for some consumers connected to the transformer.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the technology disclosed herein have been described in detail, it should be understood that the various changes, substitutions, and alterations could be made hereto without departing from the spirit and scope of the invention.

What is claimed is:

1. A transformer connection phase determination device, comprising:
a processor configured to execute a process, the process comprising:
acquiring a power value consumed by at least one consumer connected to a transformer connected to any phase corresponding to a combination of two of a plurality of distribution lines, and acquiring respective current values flowing in each of the plurality of distribution lines, in association with a time axis;
applying a filter that attenuates low frequency components in a current value caused by the power value and in the respective current values flowing in the plurality of respective power distribution lines;
computing respective correlation values indicating correlation between the current values caused by the power values to which the filter has been applied, and the respective current values flowing in the plurality of respective power distribution lines to which the filter has been applied; and
determining the phase that the transformer is connected to, based on the respective correlation values.

2. The transformer connection phase determination device of claim 1, wherein the low frequency components attenuated by the filter are frequency components representing a daily cycle of power consumed by the consumer.

3. The transformer connection phase determination device of claim 1, wherein the filter is defined by a filter coefficient optimized so as to maximize an indicator based on a difference between a correlation value indicating a lowest correlation out of the respective correlation values, and a correlation value indicating a second lowest correlation out of the respective correlation values.

4. The transformer connection phase determination device of claim 3, wherein the indicator is the difference, or an average of a plurality of the differences computed using the respective current values caused by power consumed by a plurality of consumers, or an average of standard deviations of the plurality of the differences.

5. The transformer connection phase determination device of claim 1, wherein determination of the phase to which the transformer is connected determines the phase corresponding to a combination of distribution lines that excludes the distribution line corresponding to the correlation value indicating a lowest correlation to be the phase to which the transformer is connected.

6. The transformer connection phase determination device of claim 1, wherein the process further comprises acquiring a power quantity consumed by the at least one consumer, and converting the acquired power quantity to a current value.

7. The transformer connection phase determination device of claim 6, wherein, when respective power quantities consumed by a plurality of respective consumers is acquired, the conversion includes treating a summed value of the respective power quantities as a power quantity consumed by a single hypothetical consumer.

8. A transformer connection phase determination method, comprising:
acquiring a power value consumed by at least one consumer connected to a transformer connected to any phase corresponding to a combination of two of a plurality of distribution lines, and acquiring respective current values flowing in each of the plurality of distribution lines, in association with a time axis;
applying a filter that attenuates low frequency components in a current value caused by the power value and in the respective current values flowing in the plurality of respective power distribution lines;
computing respective correlation values indicating correlation between the current values caused by the power values to which the filter has been applied, and the respective current values flowing in the plurality of respective power distribution lines to which the filter has been applied; and
by a processor, determining the phase that the transformer is connected to, based on the respective correlation values.

9. The transformer connection phase determination method of claim 8, wherein the low frequency components attenuated by the filter are frequency components representing a daily cycle of power consumed by the consumer.

10. The transformer connection phase determination method of claim 8, wherein the filter is defined by a filter coefficient optimized so as to maximize an indicator based on a difference between a correlation value indicating a lowest correlation out of the respective correlation values, and a correlation value indicating a second lowest correlation out of the respective correlation values.

11. A non-transitory recording medium storing a transformer connection phase determination program that causes a computer to execute a process, the process comprising:
   acquiring a power value consumed by at least one consumer connected to a transformer connected to any phase corresponding to a combination of two of a plurality of distribution lines, and acquiring respective current values flowing in each of the plurality of distribution lines, in association with a time axis;
   applying a filter that attenuates low frequency components in a current value caused by the power value and in the respective current values flowing in the plurality of respective power distribution lines;
   computing respective correlation values indicating correlation between the current values caused by the power values to which the filter has been applied, and the respective current values flowing in the plurality of respective power distribution lines to which the filter has been applied; and
   determining the phase that the transformer is connected to, based on the respective correlation values.

12. The non-transitory recording medium of claim 11, wherein, in the process, the low frequency components attenuated by the filter are frequency components representing a daily cycle of power consumed by the consumer.

13. The non-transitory recording medium of claim 11, wherein, in the process, the filter is defined by a filter coefficient optimized so as to maximize an indicator based on a difference between a correlation value indicating a lowest correlation out of the respective correlation values, and a correlation value indicating a second lowest correlation out of the respective correlation values.

* * * * *